(12) United States Patent
Li et al.

(10) Patent No.: US 9,466,497 B1
(45) Date of Patent: Oct. 11, 2016

(54) METHOD FOR FABRICATING A SILICON-OXIDE-NITRIDE-OXIDE-SILICON (SONOS) NON-VOLATILE MEMORY CELL

(71) Applicant: UNITED MICROELECTRONICS CORPORATION, Hsinchu (TW)

(72) Inventors: Kuo-Lung Li, Erlun Township (TW);
Ping-Chia Shih, Tainan (TW);
Hsiang-Chen Lee, Kaohsiung (TW);
Yu-Chun Chang, Taichung (TW);
Chia-Wen Wang, Tainan (TW);
Meng-Chun Chen, Kaohsiung (TW);
Chih-Yang Hsu, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/993,102

(22) Filed: Jan. 12, 2016

(51) Int. Cl.
*H01L 21/336* (2006.01)
*H01L 29/792* (2006.01)
*H01L 21/28* (2006.01)
*H01L 27/115* (2006.01)
*H01L 21/027* (2006.01)
*H01L 21/306* (2006.01)

(52) U.S. Cl.
CPC ..... *H01L 21/28282* (2013.01); *H01L 21/0273* (2013.01); *H01L 21/30604* (2013.01); *H01L 27/1157* (2013.01)

(58) Field of Classification Search
CPC .............. H01L 21/28273; H01L 21/28282; H01L 27/11582; H01L 27/11563; H01L 29/792; H01L 29/4234; H01L 29/66833; H01L 29/42384; H01L 29/78696; H01L 29/0657
See application file for complete search history.

(56) References Cited

U.S. PATENT DOCUMENTS

| | | | |
|---|---|---|---|
| 6,376,308 B1 | 4/2002 | Wang | |
| 7,071,063 B2 * | 7/2006 | Shih | H01L 27/11568 257/E21.679 |
| 8,546,226 B2 | 10/2013 | Wang | |
| 9,202,701 B1 * | 12/2015 | Chou | H01L 29/66833 |
| 2009/0175089 A1 * | 7/2009 | Eitan | G11C 16/0475 365/185.28 |

* cited by examiner

*Primary Examiner* — Pamela E Perkins
(74) *Attorney, Agent, or Firm* — Ding Yu Tan

(57) ABSTRACT

The invention provides a method for fabricating a silicon-oxide-nitride-oxide-silicon (SONOS) non-volatile memory cell, comprising: (S1) forming a pad oxide pattern on a silicon substrate having a recess exposing a tunnel region of the silicon substrate; (S2) forming a bottom oxide layer, a nitride layer, a top oxide layer covering the recess and the pad oxide pattern to form a first ONO structure; (S3) forming a photoresist on the first ONO structure covering the recess and a peripheral region of the pad oxide pattern; (S4) removing a part of the first ONO structure exposed by the photoresist to form an U-shaped ONO structure; (S5) trimming the photoresist to exposed a part of the U-shaped ONO structure above the recess; (S6) removing the part of the U-shaped ONO structure; (S7) removing the photoresist; (S8) removing the pad oxide pattern and the top oxide layer; and (S9) forming a gate structure.

19 Claims, 16 Drawing Sheets

METHOD FOR FABRICATING A SILICON-OXIDE-NITRIDE-OXIDE-SILICON (SONOS) NON-VOLATILE MEMORY CELL

FIELD OF THE INVENTION

The present invention is related to a method for fabricating a silicon-oxide-nitride-silicon (SONOS) non-volatile memory cell, especially with multi-etching steps to define tunnel region of a control gate.

BACKGROUND OF THE INVENTION

Non-volatile memory cells are widely used because they can store data even when the power supply is cut off. Each memory cell is composed of a MOS transistor and a silicon nitride layer. Since the silicon nitride layer has a high density, hot electrons tunnel through the MOS transistor to become trapped in the silicon nitride layer, thus achieving information storage. During programming, electrical charge is transferred from the substrate to the silicon nitride layer located in an oxide-nitride-oxide (ONO) layer.

In the conventional fabrication in the step of defining tunnel regions, a hard mask is formed to cover the tunnel region. However, it leads to nitride residue being formed if the hard mask covers outside the tunnel region and results in non-uniformity of sequentially performed doping process; on the other hand, it leads to underlying silicon pitting by the following etching process if the hard mask covers only the tunnel region. And thus performances of the memory cells are limited and influenced by the conventional manufacturing process.

Therefore, it is necessary to provide an advanced method for fabricating an SONOS memory cell to obviate the drawbacks and problems encountered from the prior art.

SUMMARY OF THE INVENTION

The present invention provides a manufacturing method for fabricating a silicon-oxide-nitride-oxide-silicon (SONOS) non-volatile memory cell, comprising steps of: (S1) forming a pad oxide pattern on a silicon substrate having a recess exposing a tunnel region of the silicon substrate; (S2) forming a bottom oxide layer, a nitride layer, a top oxide layer in sequence conformably covering the recess and the pad oxide pattern to form a first ONO structure; (S3) forming a photoresist on the first ONO structure covering the recess and a peripheral region of the pad oxide pattern; (S4) removing a part of the first ONO structure exposed by the photoresist to form an U-shaped ONO structure; (S5) trimming the photoresist to exposed a part of the U-shaped ONO structure above the recess; (S6) removing the part of the U-shaped ONO structure above the recess; (S7) removing the photoresist; (S8) removing the pad oxide pattern and the top oxide layer; and (S9) forming a gate structure in the tunnel region.

In one embodiment of the present invention, wherein a diameter of the recess is in a range of 0.4~0.5 micrometer.

In one embodiment of the present invention, wherein a thickness of the top oxide layer is more than a thickness of the bottom oxide layer.

In one embodiment of the present invention, wherein thicknesses of the bottom oxide layer, the nitride layer and the top oxide layer respectively are in a range of 10~30 angstroms, 60~80 angstroms, and 30~50 angstroms.

In one embodiment of the present invention, an etch chemistry used in the step (S4) has a nitride to oxide etching selectivity ratio lower than a nitride to oxide etching selectivity ratio of an etch chemistry used in the step (S6).

In one embodiment of the present invention, wherein the step (S4) is to etch the part of the first ONO structure exposed by the photoresist by an etch chemistry having a nitride to oxide etching selectivity ratio in a range of 1.2~3.0.

In one embodiment of the present invention, a duration time of the step (S4) is in a range of 60~180 seconds.

In one embodiment of the present invention, wherein the step (S6) is to dry etch the part of the U-shaped ONO structure in order to remove a part of the U-shaped ONO structure on the peripheral region of the pad oxide pattern.

In one embodiment of the present invention, wherein an etch chemistry used in the step (S6) has a nitride to oxide etching selectivity ratio in a range of 2.0~4.0.

In one embodiment of the present invention, wherein a duration time of the step (S6) is in a range of 30~60 seconds.

In one embodiment of the present invention, wherein a thickness of the pad oxide pattern is reduced in the step (S6).

In one embodiment of the present invention, wherein a thickness of the pad oxide pattern is in a range of 100~120 angstroms.

In one embodiment of the present invention, after the step (S6), the remaining portion of the U-shaped ONO structure is only in the recess and becomes ⊔-shaped.

In one embodiment of the present invention, wherein the silicon substrate comprises the tunnel region exposed by the pad oxide pattern and a select gate region covered by the pad oxide pattern.

In one embodiment of the present invention, wherein the gate structure is plural and formed separately in the tunnel region and in the select gate region.

In one embodiment of the present invention, the step (S9) comprises steps of: (S91) forming a core oxide layer on the silicon substrate and the nitride layer to form a second ONO structure in the tunnel region; (S92) forming a gate electrode on the second ONO structure; and (S93) removing a portion of the second ONO structure exposed by the gate electrode to form the gate structure.

In one embodiment of the present invention, the method further comprises (S10) doping the silicon substrate using the gate structure as a mask.

In one embodiment of the present invention, wherein the core oxide layer has a thickness in a range of 50~70 angstroms.

Accordingly, the present invention provides a method for fabricating a silicon-oxide-nitride-silicon (SONOS) non-volatile memory cell by multi-etching steps to define tunnel region of a control gate in order to solve problems of silicon pitting and/or nitride residue due to conventional manufacturing process. In addition, the method provided by the present invention can be integrated in to the conventional process and thus to improve product performances and also product yields without largely increasing in manufacturing costs.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a method for fabricating a silicon-oxide-nitride-silicon (SONOS) non-volatile memory cell by multi-etching steps to define tunnel region of a control gate and is described more specifically with reference to the following embodiments. It is to be noted that the following descriptions of preferred embodiments of this invention are presented herein for purpose of illustration and description only but not intended to be exhaustive or to be limited to the precise form disclosed.

Figure 1:
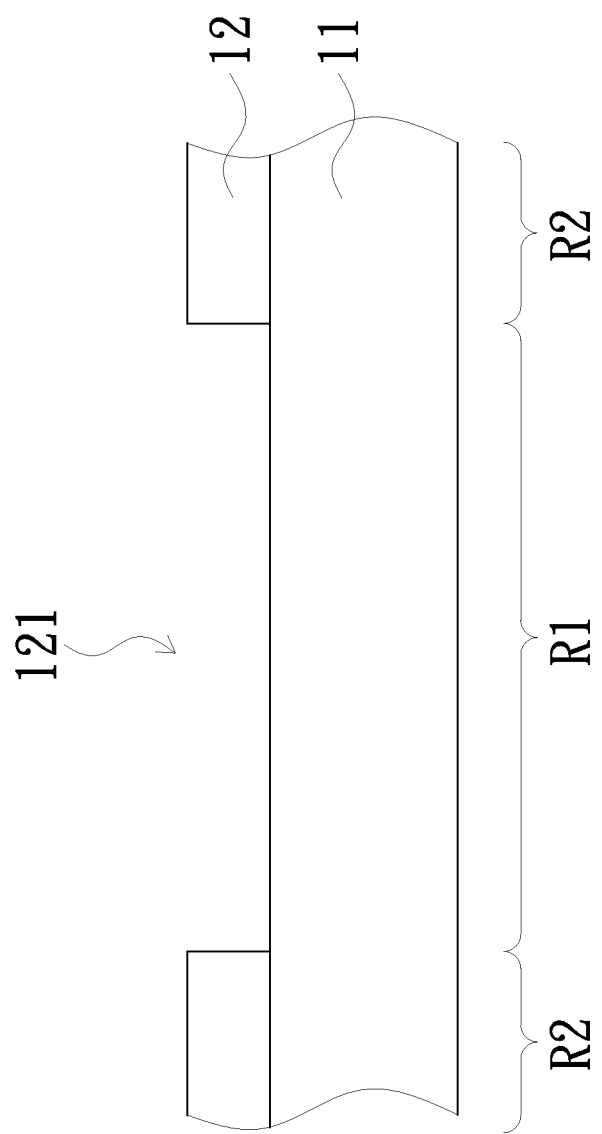
FIG. 1 is a cross-sectional view according to a step of the method provided by the present invention.

As shown in FIG. 1, a silicon substrate 11 is provided and a pad oxide pattern 12 is formed on the silicon substrate 11 having a recess 121 to expose a tunnel region R1 of the silicon substrate 11. The tunnel region R1 is where (a region set aside) to form a control gate of a non-volatile memory cell, and a select gate region R2 is where to form at least one select gate of a non-volatile memory cell. A thickness of the pad oxide pattern 12 is in a range of 100~120 angstroms and a dimension of the recess 121 is in a range of 0.4~0.5 micrometer. In one embodiment, a thickness of the pad oxide pattern 12 is 110 angstroms.

Figure 2:
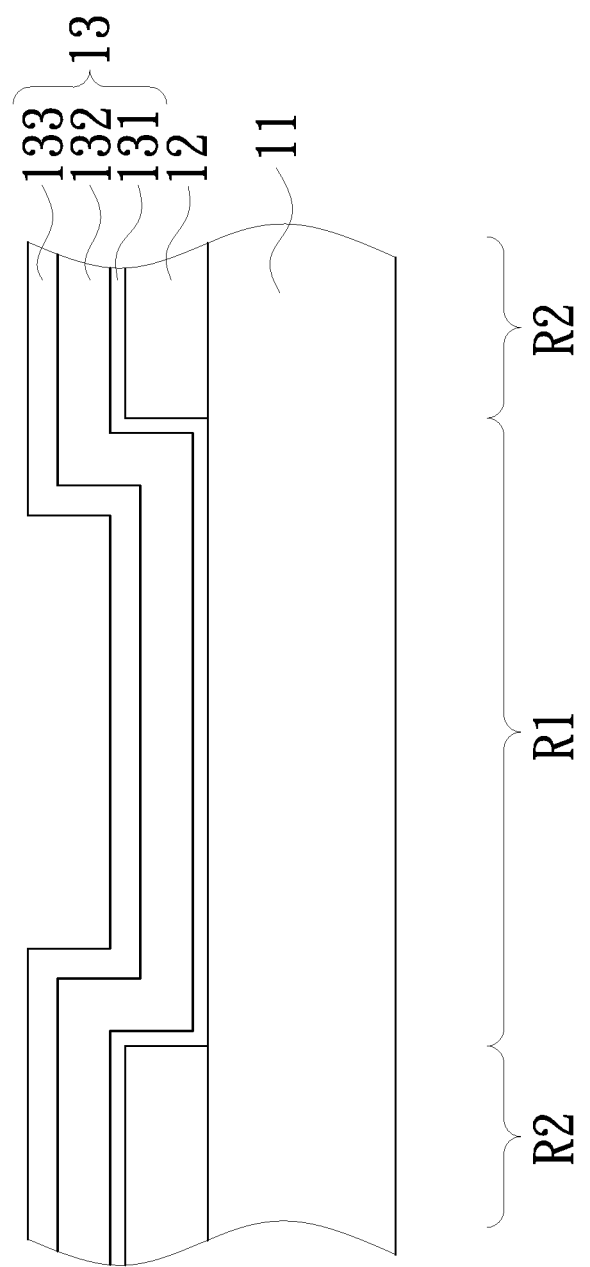
FIG. 2 is a cross-sectional view according to a step of the method provided by the present invention after the step shown in FIG. 1.

Then as shown in FIG. 2, a bottom oxide layer 131, a nitride layer 132 and a top oxide layer 133 are formed in sequence on the silicon substrate 11 conformally covering the recess 121 and the pad oxide pattern 12. The bottom oxide layer 131, the nitride layer 132 and the top oxide layer 133 together form a first ONO structure 13 on the silicon substrate 11. A thickness of the nitride layer 132 is more than a thickness of the top oxide layer 133, and a thickness of the top oxide layer 133 is more than a thickness of the bottom oxide layer 131. For examples, the bottom oxide layer 131 has a thickness in a range of 10~30 angstroms, the nitride layer 132 has a thickness in a range of 60~80 angstroms, and the top oxide layer 133 has a thickness in a range of 30~50 angstroms. In an embodiment of the present invention, the bottom oxide layer 131 has a thickness of 20 angstroms, the nitride layer 132 has a thickness of 70 angstroms, and the top oxide layer 133 has a thickness of 40 angstroms.

Figure 3:
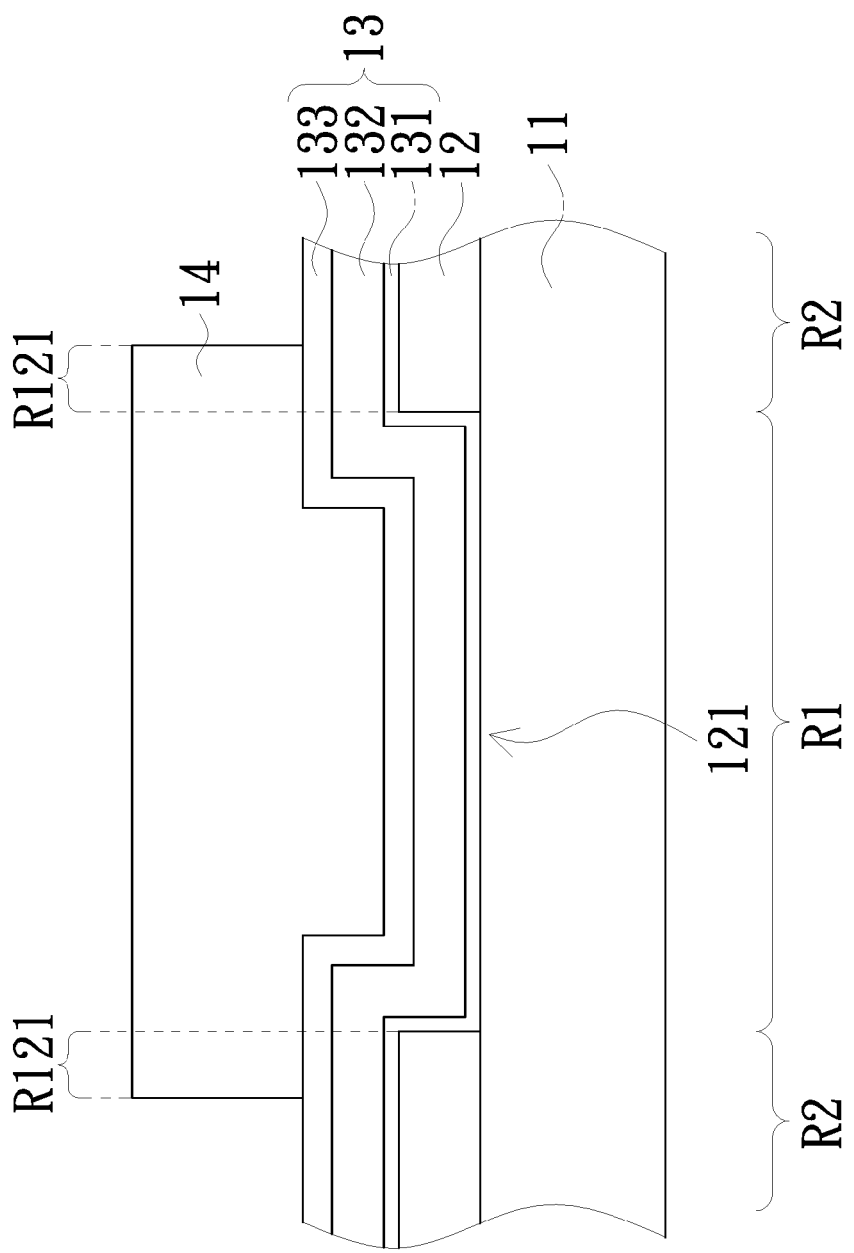
FIG. 3 is a cross-sectional view according to a step of the method provided by the present invention after the step shown in FIG. 2.

Next as shown in FIG. 3, a photoresist 14 is formed on the first ONO structure 13 covering the recess 121 and a peripheral region R121 of the pad oxide pattern 12. The peripheral region R121 of the pad oxide pattern 12 is directly adjacent to the recess 121.

Figure 4:
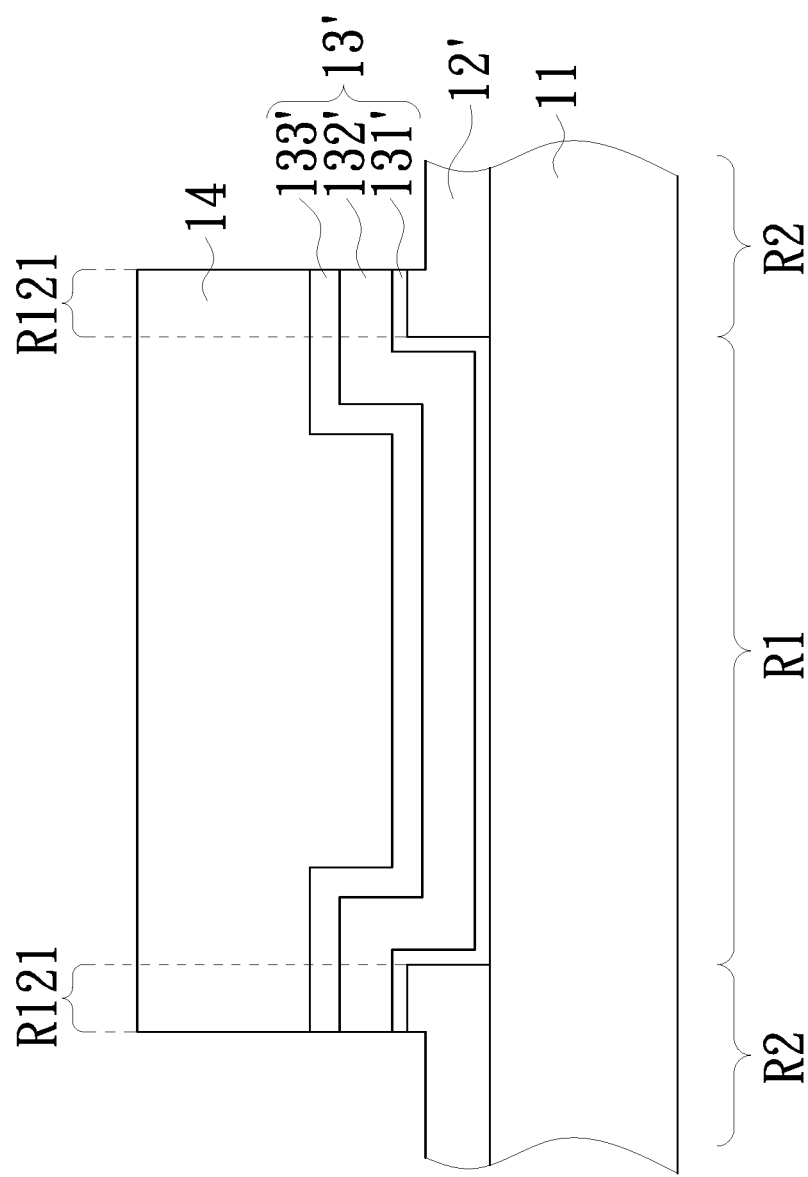
FIG. 4 is a cross-sectional view according to a step of the method provided by the present invention after the step shown in FIG. 3.

A heavy etch is performed used the photoresist 14 as a mask to remove a part of the first ONO structure 13 exposed by the photoresist 14 to form an U-shaped ONO structure 13' formed by a remaining U-shaped bottom oxide layer 131', U-shaped nitride layer 132', and U-shaped top oxide layer 133', as shown in FIG. 4. An etch chemistry used in this step has a nitride-to-oxide etching selectivity ratio in a range of 1.2~3.0, and a duration time of the heavy etch in this step is in a range of 60~180 seconds. A part of the pad oxide pattern 12 exposed by the photoresist 14 is also slightly removed by the heavy etch to form a pad oxide pattern 12' as shown in FIG. 4. Thus, it results in a slight step height of the pad oxide pattern 12' formed between the peripheral region R121 and the exposed part of the pad oxide pattern 12' exposed by the photoresist 14.

Figure 5:
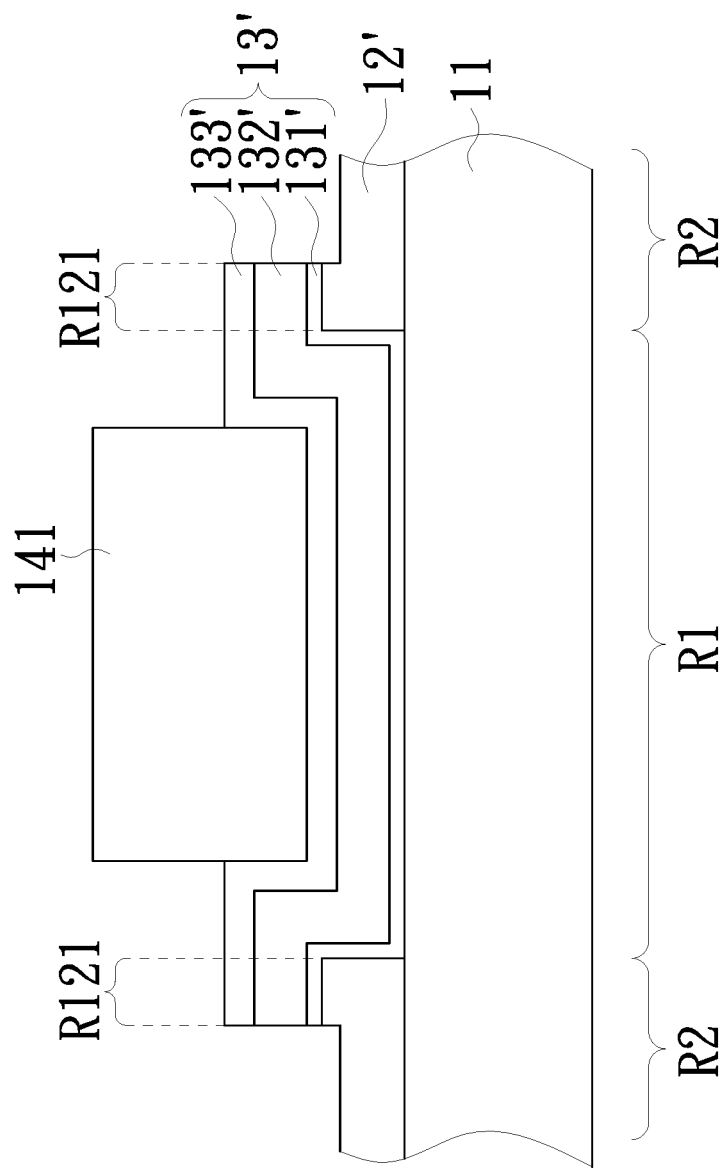
FIG. 5 is a cross-sectional view according to a step of the method provided by the present invention after the step shown in FIG. 4.

After, the photoresist 14 is trimmed by a plasma etching process to expose a part of the U-shaped ONO structure 13' that is above the recess 121 including where (a portion thereof was previously) covering the peripheral region R121 to form a photoresist 141, as shown in FIG. 5. The photoresist 141 is trimmed in dimension approximately to be only covering a horizontal portion of the U-shaped ONO structure 13' in the recess 121. In some embodiments, the photoresist 14 is an organic material and can be reduced not just in dimension but also in thickness/height.

Figure 6:
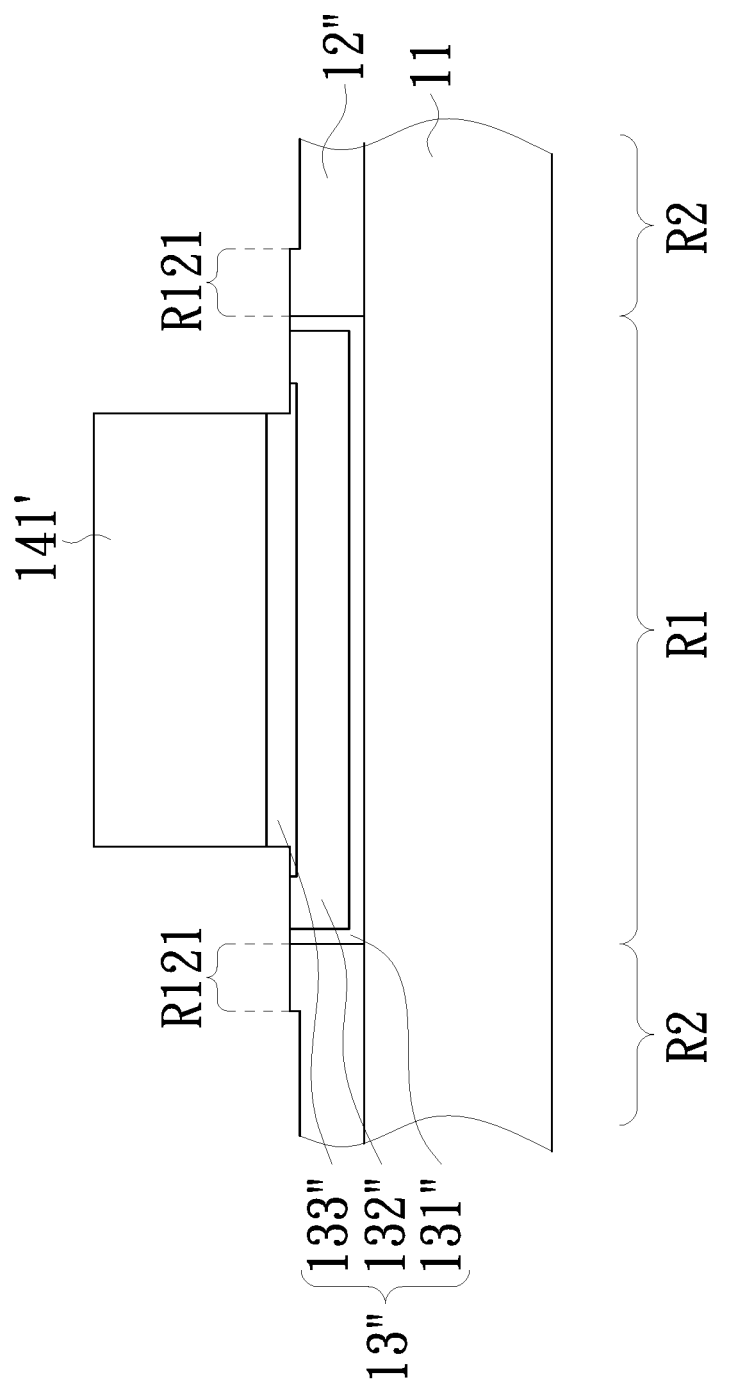
FIG. 6 is a cross-sectional view according to a step of the method provided by the present invention after the step shown in FIG. 5.

Then as shown in FIG. 6, a light etch is performed to remove the part of the U-shaped ONO structure 13' that is above the recess 121 to form a ⊔-shaped ONO structure 13" only in the recess 121. The light etch can be a lightly dry etch, and an etch chemistry used in the lightly dry etch has a nitride to oxide etching selectivity ratio higher than the nitride to oxide etching selectivity ratio of the etchant used in the heavy etch. For example, the etch chemistry used in the light etch has a nitride to oxide etching selectivity ratio in a range of 2.0~4.0. In addition, a duration time of the light etch is shorter than the heavy etch; for instance, a duration time of the light etch is in a range of 30~60 seconds. The photoresist 141 is also partly removed by reduction in height, and thus a thickness of the photoresist 141 is reduced to form a photoresist 141' due to the plasma dry etch. The pad oxide pattern 12' is also partly removed by reducing in thickness to form a pad oxide pattern 12" as shown in FIG. 6. The ⊔-shaped ONO structure 13" is formed by the bottom oxide layer 131", the nitride layer 132" and the top oxide layer 133", wherein shapes of the bottom oxide layer 131", the nitride layer 132" and the top oxide layer 133" can be slightly different depending on thickness of each. In one embodiment, the pad oxide pattern 12 is 110 angstroms, the bottom oxide layer 131 is 20 angstroms, the nitride layer 132 and the top oxide layer 133 is 40 angstroms; and thus in this embodiment, the bottom oxide layer 131" is ⊔-shaped, the nitride layer 132" is possibly also ⊔-shaped but in smaller size and shallower in depth, and the top oxide layer 133" is ⊔-shaped. In other embodiment, the top oxide layer 133" can be —-shaped.

Figure 7:
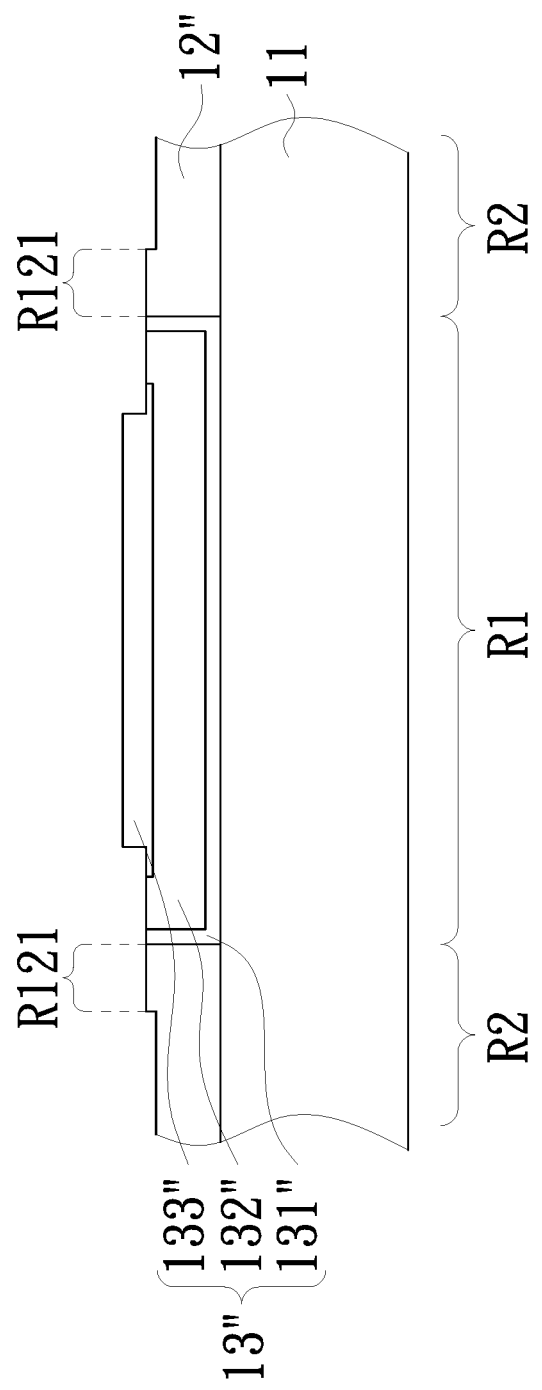
FIG. 7 is a cross-sectional view according to a step of the method provided by the present invention after the step shown in FIG. 6.
Figure 8:
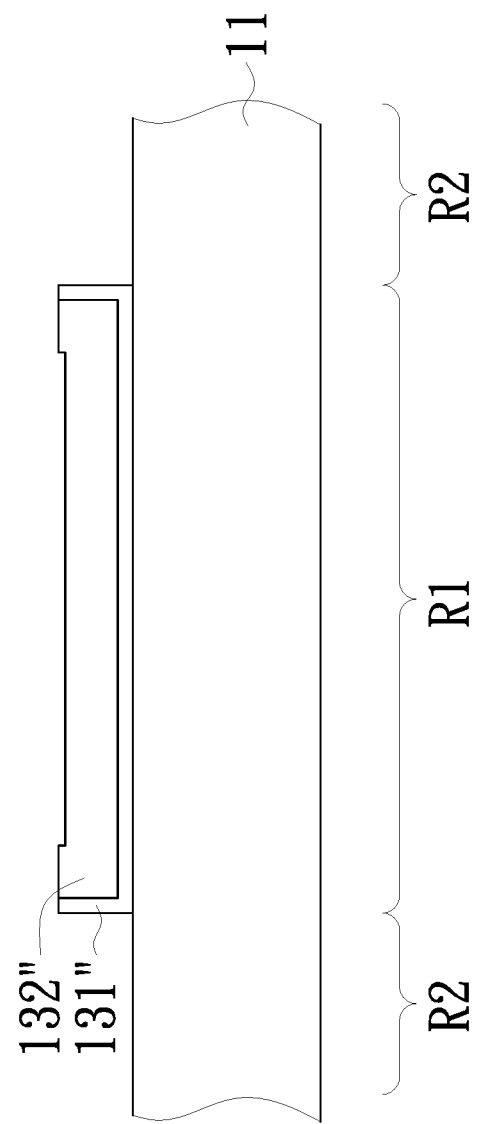
FIG. 8 is a cross-sectional view according to a step of the method provided by the present invention after the step shown in FIG. 7.

Then as shown in FIG. 7, the photoresist 141' is firstly removed, and then the pad oxide pattern 12" and the top oxide layer 133" are removed by acid solution, as shown in FIG. 8, to expose the silicon substrate 11 and the bottom oxide layer 131" and left behind the nitride layer 132". Then a gate structure is subsequently formed thereon.

Figure 9:
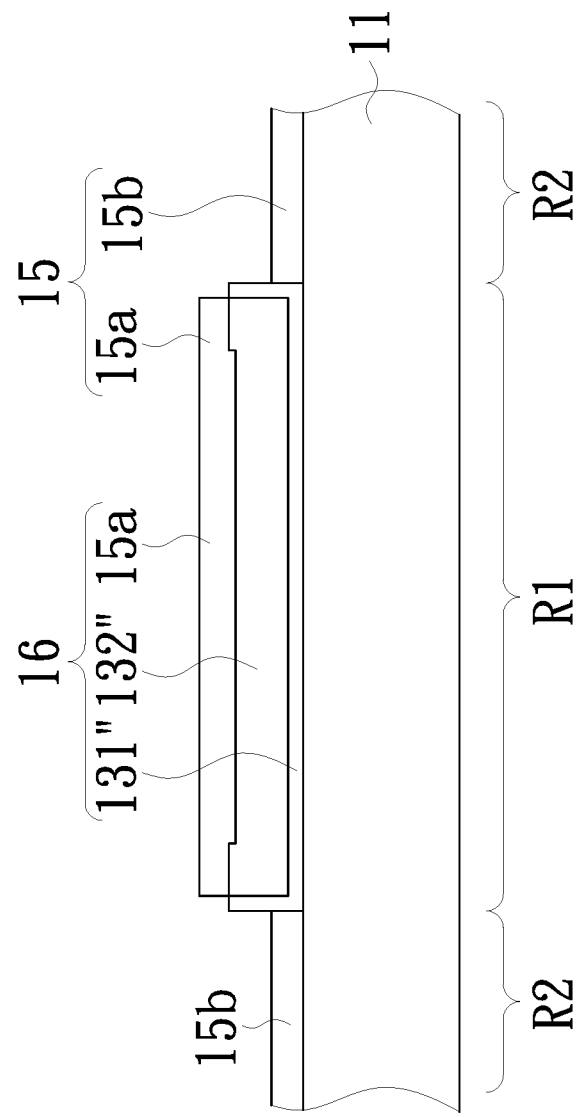
FIG. 9 is a cross-sectional view according to a step of the method provided by the present invention after the step shown in FIG. 8.

To form the gate structure, as shown in FIG. 9, a core oxide layer 15 is formed on the nitride layer 132" and on the silicon substrate 11, wherein the core oxide layer 15 includes a core oxide layer 15a on the nitride layer 132" and a core oxide layer 15b on the exposed silicon substrate 11. The core oxide layer 15 can be formed by thermal oxidation. Therefore, the core oxide layer 15a and 15b are formed by the nitride layer 132" and the silicon substrate 11 reacting with precursors and transforming very top surface of the nitride layer 132" and very top surface of the silicon substrate 11 into oxide respectively. The core oxide layer 15 has a thickness in a range of 50~70 angstroms. The bottom oxide layer 131", the nitride layer 132" and the core oxide layer 15a are together to form a second ONO structure 16.

Figure 10:
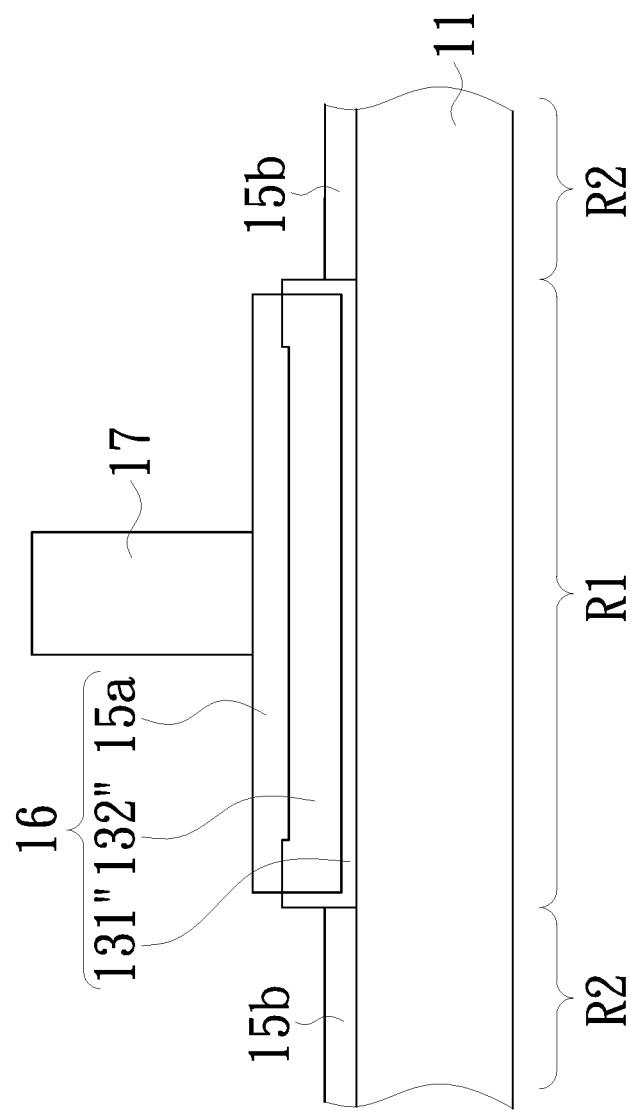
FIG. 10 is a cross-sectional view according to a step of the method provided by the present invention after the step shown in FIG. 9.

As shown in FIG. 10, a gate electrode 17 is then formed in the tunnel region R1 on the second ONO structure 16. The gate electrode 17 can be formed by silicon deposition and then a photolithographic process to define the gate electrode 17.

Figure 11:
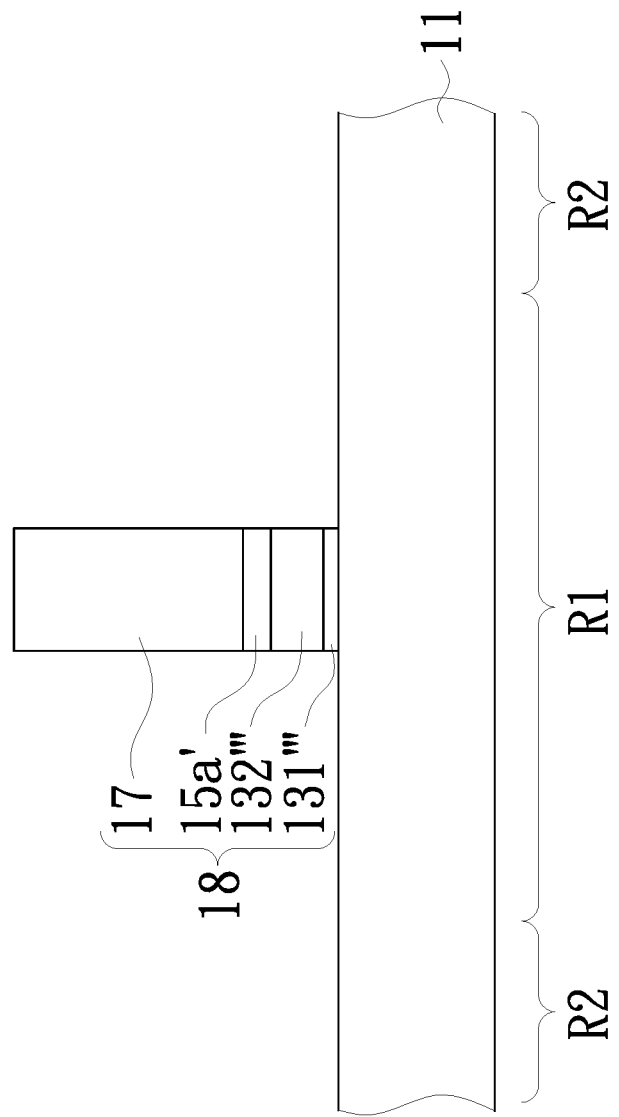
FIG. 11 is a cross-sectional view according to a step of the method provided by the present invention after the step shown in FIG. 10.

And then an etching process is performed using the gate electrode 17 as a mask to remove a part of the second ONO structure 16 exposed by the gate electrode 17 in order to form a gate structure 18 as shown in FIG. 11. After the etching process, the bottom oxide layer 131" is partly removed to form a —-shaped tunnel oxide layer 131''', the nitride layer 132" is partly removed to form a —-shaped nitride layer 132''', and the core oxide layer 15a is also partly removed to form a —-shaped core oxide layer 15a'. Thus, the remaining portion of the second ONO structure is —-shaped and together with the gate electrode 17 to form the gate structure 18.

Figure 12:
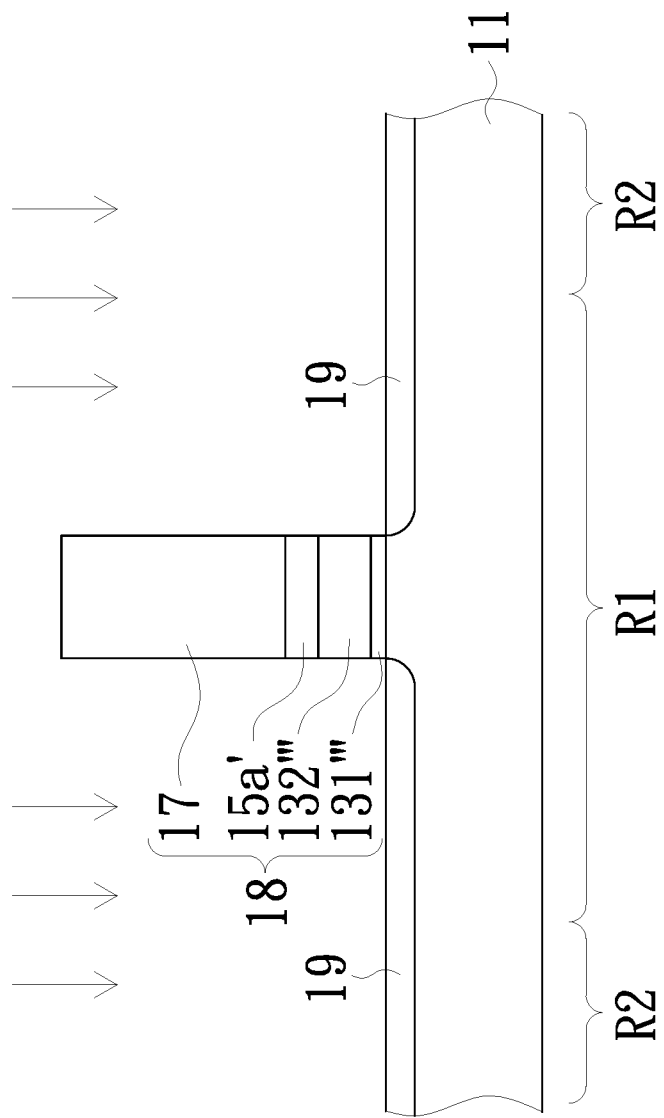
FIG. 12 is a cross-sectional view according to a step of the method provided by the present invention after the step shown in FIG. 11.
Figure 13:
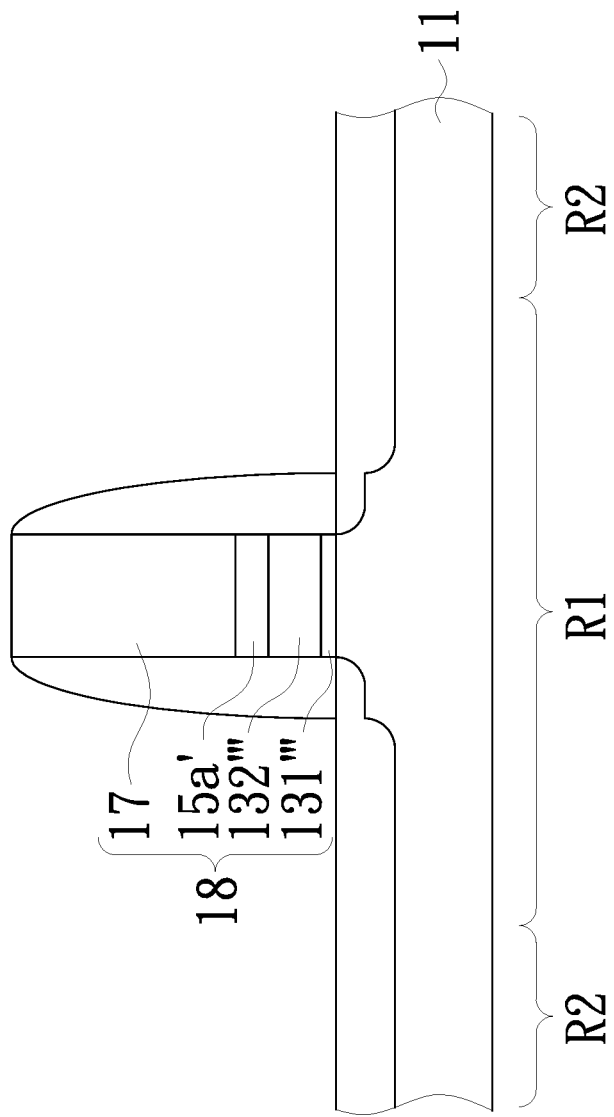
FIG. 13 is a cross-sectional view according to a step of the method provided by the present invention after the step shown in FIG. 12.

An implantation process is performed afterward to form a light doped drain (LDD) region 19 by using the gate structure 18 as a mask to dope the silicon substrate 11, as shown by arrowed lines in FIG. 12. Then spacers and source/drain region are sequentially formed by conventional fabrication process as shown in FIG. 13.

Figure 14:
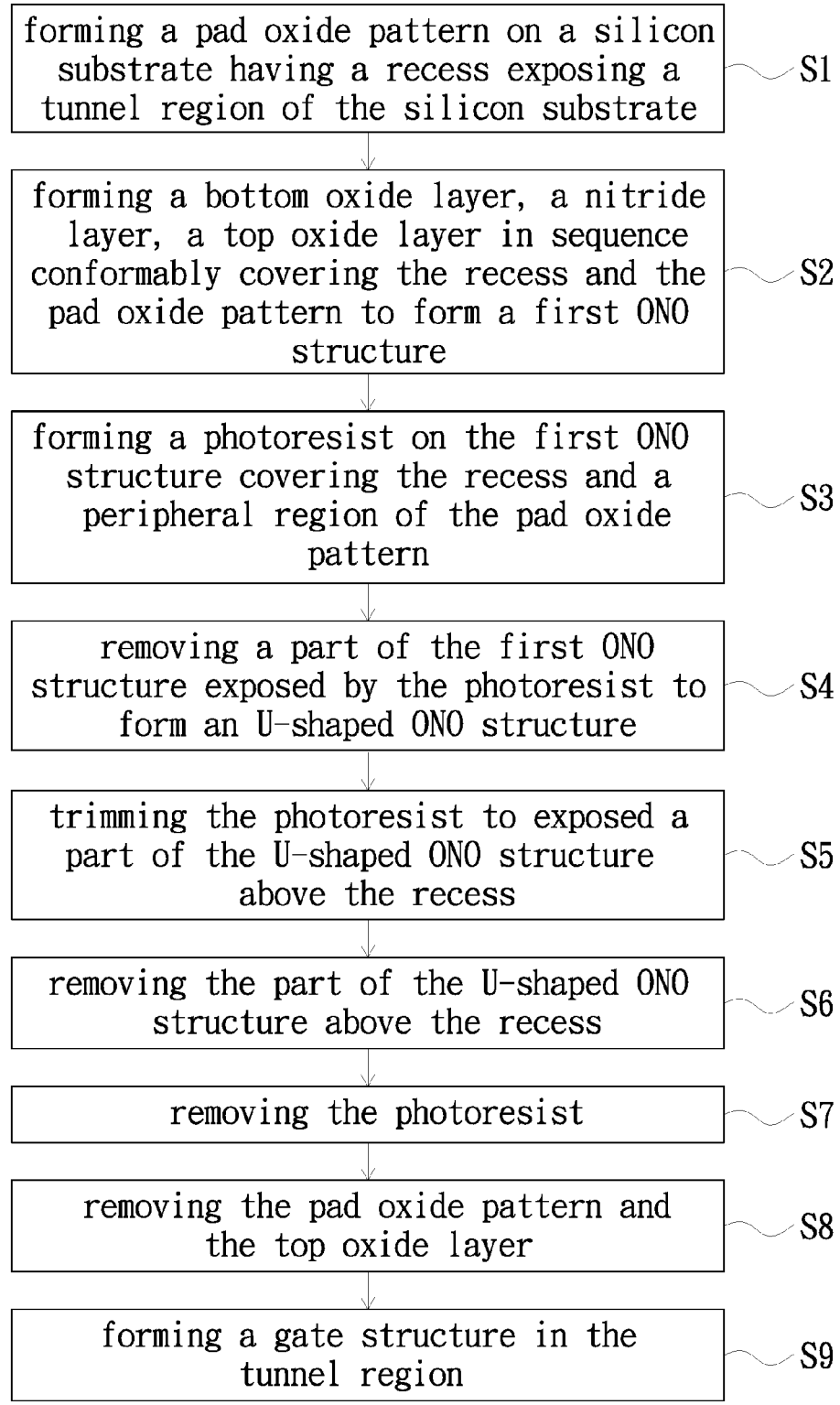
FIG. 14 illustrates steps of a process according to the method provided by the present invention.
Figure 14A:
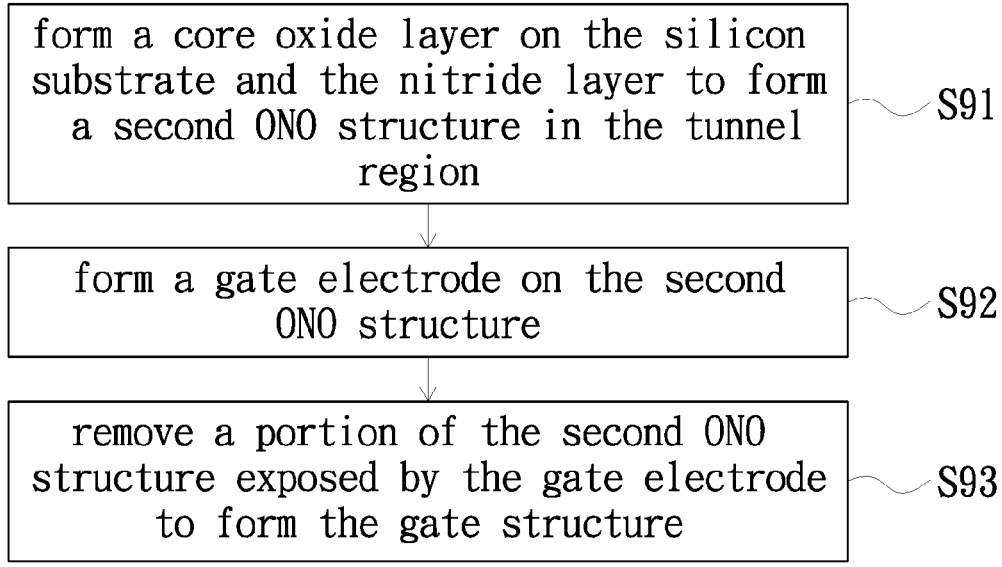
FIG. 14A illustrates steps of a formation of a gate structure according to an embodiment provided by the present invention and FIG. 15 is a cross-sectional view of a flash memory cell according to an embodiment of the present invention.

According to the FIGS. 1-13 and above description, the present invention provides a method for fabricating a silicon-oxide-nitride-oxide-silicon (SONOS) non-volatile memory cell comprising steps as shown in FIG. 14. Step (S1) is to form a pad oxide pattern on a silicon substrate having a recess exposing a tunnel region of the silicon substrate, as illustrated in FIG. 1; step (S2) is to form a bottom oxide layer, a nitride layer, a top oxide layer in sequence conformally covering the recess and the pad oxide pattern to form a first ONO structure, as illustrated in FIG. 2; step (S3) is to form a photoresist on the first ONO structure covering the recess and a peripheral region of the pad oxide pattern, as illustrated in FIG. 3; step (S4) is to remove a part of the first ONO structure exposed by the photoresist to form an U-shaped ONO structure, as illustrated in FIG. 4; step (S5) is to trim the photoresist to exposed a part of the U-shaped ONO structure above the recess, as illustrated in FIG. 5; step (S6) is to remove the part of the U-shaped ONO structure above the recess, as illustrated in FIG. 6; step (S7) is to remove the photoresist, as illustrated in FIG. 7; step (S8) is to remove the pad oxide pattern and the top oxide layer, as illustrated in FIG. 8; and step (S9) is to form a gate structure in the tunnel region, as illustrated in FIGS. 9-11, wherein the step (S9) comprises the sub-steps (S91)-(S93) as illustrated in FIG. 14A. The sub-step (S91) is to form a core oxide layer on the silicon substrate and the nitride layer to form a second ONO structure in the tunnel region, as illustrated in FIG. 9; the sub-step (S92) is to form a gate electrode on the second ONO structure, as illustrated in FIG. 10; and the sub-step (S93) is to remove a portion of the second ONO structure exposed by the gate electrode to form the gate structure, as illustrated in FIG. 11. Then the implantation process as shown in FIG. 12 and the product produced following the provided method is shown as in FIG. 13.

Figure 15:
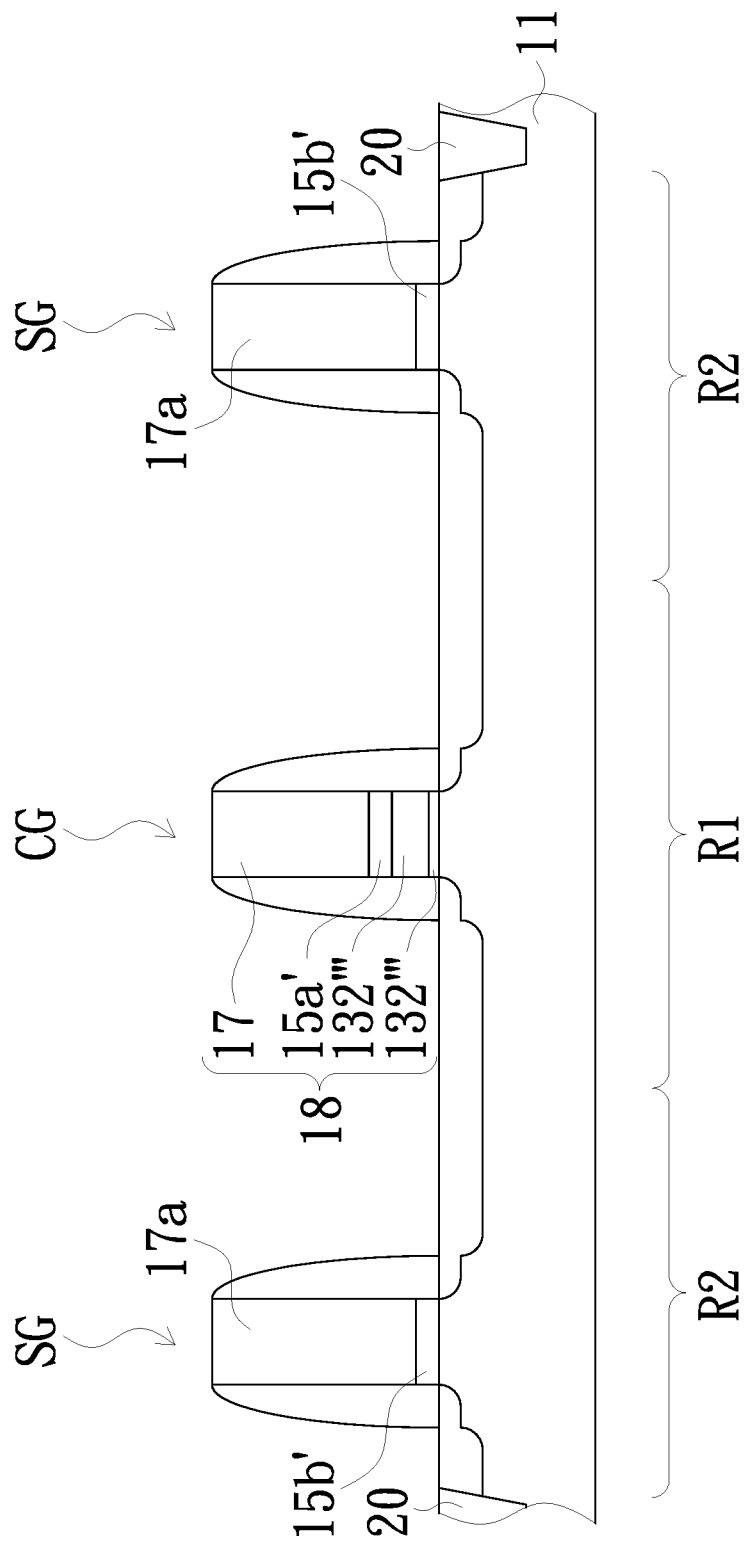

According to the method provided by the present invention, a flash memory cell is fabricated as shown in FIG. 15. The same elements use the same numbers as labeled in FIGS. 1-13 for simple illustration only but not limit the present invention into the certain embodiment. The flash memory cell comprises a silicon substrate 11 having the tunnel region R1 and the select gate region R2 on the two opposite sides of the tunnel region R1 between two isolation structures 20. The gate structures formed in the tunnel region R1 is a control gate structure CG following the above illustrated process, and two select gate structures SG are formed in the two opposite sides of the control gate structure CG respectively in the select gate region R2. Wherein the formation of the two select gate structures SG can be applied into the above process that in the sub-step (S92), two gate electrodes 17a are also formed on a portion of the core oxide layer 15b in the select gate region R2; and in the sub-step (S93), a portion of the core oxide layer 15b exposed by the gate electrodes 17a is also removed to form a core oxide layer 15b' as shown in FIG. 15.

Therefore, the present invention provides a method for fabricating a silicon-oxide-nitride-silicon (SONOS) non-volatile memory cell by multi-etching steps to define tunnel region of a control gate in order to solve problems of silicon pitting and/or nitride residue due to conventional manufacturing process. In addition, the method provided by the present invention can be integrated in to the conventional process and thus to improve product performances and also product yields without largely increasing in manufacturing costs.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a silicon-oxide-nitride-oxide-silicon (SONOS) non-volatile memory cell, comprising steps of:
    (S1) forming a pad oxide pattern on a silicon substrate having a recess exposing a tunnel region of the silicon substrate;

(S2) forming a bottom oxide layer, a nitride layer, a top oxide layer in sequence conformally covering the recess and the pad oxide pattern to form a first ONO structure;

(S3) forming a photoresist on the first ONO structure covering the recess and a peripheral region of the pad oxide pattern;

(S4) removing a part of the first ONO structure exposed by the photoresist to form an U-shaped ONO structure;

(S5) trimming the photoresist to exposed a part of the U-shaped ONO structure above the recess;

(S6) removing the part of the U-shaped ONO structure above the recess;

(S7) removing the photoresist;

(S8) removing the pad oxide pattern and the top oxide layer; and (S9) forming a gate structure in the tunnel region.

2. The method for fabricating the silicon-oxide-nitride-oxide-silicon (SONOS) non-volatile memory cell according to claim 1, wherein a dimension of the recess is in a range of 0.4~0.5 micrometer.

3. The method for fabricating the silicon-oxide-nitride-oxide-silicon (SONOS) non-volatile memory cell according to claim 1, wherein a thickness of the top oxide layer is more than a thickness of the bottom oxide layer.

4. The method for fabricating the silicon-oxide-nitride-oxide-silicon (SONOS) non-volatile memory cell according to claim 3, wherein thicknesses of the bottom oxide layer, the nitride layer and the top oxide layer respectively are in a range of 10~30 angstroms, 60~80 angstroms, and 30~50 angstroms.

5. The method for fabricating the silicon-oxide-nitride-oxide-silicon (SONOS) non-volatile memory cell according to claim 1, wherein an etch chemistry used in the step (S4) has a nitride to oxide etching selectivity ratio lower than a nitride to oxide etching selectivity ratio of an etch chemistry used in the step (S6).

6. The method for fabricating the silicon-oxide-nitride-oxide-silicon (SONOS) non-volatile memory cell according to claim 1, wherein the step (S4) is to etch the part of the first ONO structure exposed by the photoresist by an etch chemistry having a nitride to oxide etching selectivity ratio in a range of 1.2~3.0.

7. The method for fabricating the silicon-oxide-nitride-oxide-silicon (SONOS) non-volatile memory cell according to claim 1, wherein a duration time of the step (S4) is in a range of 60~180 seconds.

8. The method for fabricating a silicon-oxide-nitride-oxide-silicon (SONOS) non-volatile memory cell according to claim 1, wherein the step (S6) is to dry etch the part of the U-shaped ONO structure in order to remove a part of the U-shaped ONO structure on the peripheral region of the pad oxide pattern.

9. The method for fabricating the silicon-oxide-nitride-oxide-silicon (SONOS) non-volatile memory cell according to claim 8, wherein an etch chemistry used in the step (S6) has a nitride to oxide etching selectivity ratio in a range of 2.0~4.0.

10. The method for fabricating the silicon-oxide-nitride-oxide-silicon (SONOS) non-volatile memory cell according to claim 1, wherein a duration time of the step (S6) is in a range of 30~60 seconds.

11. The method for fabricating the silicon-oxide-nitride-oxide-silicon (SONOS) non-volatile memory cell according to claim 1, wherein a thickness of the pad oxide pattern is reduced in the step (S6).

12. The method for fabricating the silicon-oxide-nitride-oxide-silicon (SONOS) non-volatile memory cell according to claim 1, wherein a thickness of the pad oxide pattern is in a range of 100~120 angstroms.

13. The method for fabricating the silicon-oxide-nitride-oxide-silicon (SONOS) non-volatile memory cell according to claim 1, wherein after the step (S6), the remaining portion of the U-shaped ONO structure is only in the recess and becomes ⊔-shaped.

14. The method for fabricating the silicon-oxide-nitride-oxide-silicon (SONOS) non-volatile memory cell according to claim 1, wherein the silicon substrate comprises the tunnel region exposed by the pad oxide pattern and a select gate region covered by the pad oxide pattern.

15. The method for fabricating the silicon-oxide-nitride-oxide-silicon (SONOS) non-volatile memory cell according to claim 14, wherein the gate structure is plural and formed separately in the tunnel region and in the select gate region.

16. The method for fabricating the silicon-oxide-nitride-oxide-silicon (SONOS) non-volatile memory cell according to claim 1, the step (S9) comprises sub-steps of:

(S91) forming a core oxide layer on the silicon substrate and the nitride layer to form a second ONO structure in the tunnel region;

(S92) forming a gate electrode on the second ONO structure; and (S93) removing a portion of the second ONO structure exposed by the gate electrode to form the gate structure.

17. The method for fabricating the silicon-oxide-nitride-oxide-silicon (SONOS) non-volatile memory cell according to claim 16, the method further comprises step of:

(S10) doping the silicon substrate using the gate structure as a mask.

18. The method for fabricating the silicon-oxide-nitride-oxide-silicon (SONOS) non-volatile memory cell according to claim 16, wherein after the sub-step (S93), a remaining portion of the second ONO structure is ⌐-shaped.

19. The method for fabricating the silicon-oxide-nitride-oxide-silicon (SONOS) non-volatile memory cell according to claim 1, wherein the core oxide layer has a thickness in a range of 50~70 angstroms.

* * * * *